United States Patent
Udren

(10) Patent No.: US 12,259,413 B2
(45) Date of Patent: Mar. 25, 2025

(54) FAULT DETECTION IN AN ELECTRIC POWER SYSTEM

(71) Applicant: Quanta Technology, LLC, Raleigh, NC (US)

(72) Inventor: Eric Udren, Pittsburgh, PA (US)

(73) Assignee: Quanta Technology, LLC, Raleigh, NC (US)

( * ) Notice: Subject to any disclaimer, the term of this patent is extended or adjusted under 35 U.S.C. 154(b) by 361 days.

(21) Appl. No.: 17/665,235

(22) Filed: Feb. 4, 2022

(65) Prior Publication Data

US 2022/0252644 A1   Aug. 11, 2022

Related U.S. Application Data

(60) Provisional application No. 63/146,320, filed on Feb. 5, 2021.

(51) Int. Cl.
| | | |
|---|---|---|
| *G01R 19/10* | (2006.01) | |
| *H02H 1/00* | (2006.01) | |
| *H02H 3/04* | (2006.01) | |
| *H02H 3/26* | (2006.01) | |

(52) U.S. Cl.
CPC ........... *G01R 19/10* (2013.01); *H02H 1/0007* (2013.01); *H02H 3/04* (2013.01); *H02H 3/265* (2013.01)

(58) Field of Classification Search
CPC ........ G01R 19/10; H02H 1/0007; H02H 3/04; H02H 3/265; H02H 7/261; H02H 1/0092; H02H 3/32
USPC ..... 361/56, 57, 65, 91.1, 93.1; 324/512, 522
See application file for complete search history.

(56) References Cited

U.S. PATENT DOCUMENTS

| | | | |
|---|---|---|---|
| 9,413,156 B2 | 8/2016 | O'Brien et al. | |
| 9,478,968 B2* | 10/2016 | Blumschein | H02H 1/0092 |
| 10,228,408 B2* | 3/2019 | Dzienis | G01R 31/086 |
| 10,527,666 B2* | 1/2020 | Jurisch | G01R 31/088 |
| 2009/0231769 A1* | 9/2009 | Fischer | H02H 3/286 |
| | | | 361/87 |
| 2013/0107405 A1* | 5/2013 | Blumschein | G01R 31/085 |
| | | | 702/58 |
| 2017/0146587 A1* | 5/2017 | Jurisch | G01R 31/088 |
| 2017/0276718 A1* | 9/2017 | Dzienis | H03H 7/0138 |

FOREIGN PATENT DOCUMENTS

EP      3171185 B1 *  6/2018   ........... G01R 31/088

\* cited by examiner

*Primary Examiner* — Jared Fureman
*Assistant Examiner* — Nicolas Bellido
(74) *Attorney, Agent, or Firm* — Murphy, Bilak & Homiller, PLLC

(57) ABSTRACT

A fault protection system is configured to detect a fault in an electric power system. The fault protection system obtains a differential measurement signal. The differential measurement signal may, for example, indicate, as a function of time, the difference between currents or voltages measured at two or more terminals or boundaries of a fault protection zone of the electric power system. Regardless, the fault protection system generates a fault detection signal by cross-correlating the differential measurement signal with a reference signal. The reference signal may for instance be the differential measurement signal that is expected upon occurrence of a fault. The fault protection system performs fault detection, for detecting a fault internal to the fault protection zone, as a function of the fault detection signal.

31 Claims, 8 Drawing Sheets

FAULT DETECTION IN AN ELECTRIC POWER SYSTEM

RELATED APPLICATIONS

This application claims the benefit of U.S. Provisional Patent Application No. 63/146,320, filed Feb. 5, 2021, which is incorporated by reference herein in its entirety.

TECHNICAL FIELD

The present application relates generally to an electric power system, and relates more particularly to fault detection in such a system.

BACKGROUND

In an electric power system, a fault is any abnormal condition of the system that causes currents and/or voltages in the system to deviate from their nominal values and/or results in energy being dissipated in a manner other than serving the intended load. In a ground fault, for example, current flows into the Earth, disrupting the nominal currents and voltages of the system. A fault may be caused by any number of sources, such as the failure of electrical equipment in the system, human errors, and/or environmental phenomena. Regardless, the deviation in the currents and/or voltages in the system interrupts the normal electrical flows, risks equipment damage, and/or poses safety hazards to humans.

A fault protection system detects the occurrence of a fault so that actions can be taken to protect against the fault. The actions may include remedial actions to restore the electric power system to a non-fault state and/or include safety measures to guard against possible harm from the fault. The fault protection system may for instance trip a circuit breaker or other protection device upon occurrence of a fault, in order to isolate the fault and its impact.

Known approaches to detecting a fault include detecting excessive currents flowing towards the fault point. However, high-impedance faults, such as may occur from a downed conductor contacting the earth in a power distribution system, do not result in excessive currents and tend to exhibit random behavior with unstable and wide fluctuations in current levels. This is the case not only for high-impedance faults above 2,000 ohms, but especially for high-impedance faults that are on the order of 25,000 ohms. High-impedance faults are therefore particularly challenging to detect using known approaches as such approaches prove insufficient in detection sensitivity, reliability, and/or speed. High-impedance faults continue to pose severe fire and safety risk.

SUMMARY

Some embodiments herein detect a fault in a fault protection zone of an electric power system, e.g., a short-circuit fault or abnormality. Some embodiments detect such a fault by detecting evidence of the fault embedded in a measurement signal, e.g., waveform evidence embedded in a current or voltage measurement signal. One or more embodiments detect this evidence, for example, by cross-correlating the measurement signal with a reference signal that is expected to occur with a fault.

According to some embodiments in this regard, a fault protection system pinpoints a particular differential measurement signal that is expected to occur with a fault and exploits cross-correlation in order to detect a fault when the expected differential measurement signal occurs. The fault protection system in this way is able to detect a fault that would otherwise be obscured by the noise of routine random measurement variations. In doing so, some embodiments advantageously offer high-impedance fault detection that has higher sensitivity, better dependability, and/or quicker speed than otherwise possible.

More particularly, some embodiments herein include a fault protection system for an electric power system. The fault protection system may for instance include one or more processing circuits configured for fault protection. The fault protection system (e.g., via the one or more processing circuits) is configured to obtain a differential measurement signal. The fault protection system is further configured to generate a fault detection signal by cross-correlating the differential measurement signal with a reference signal, e.g., over a correlation window that spans a maximum possible duration of a fault to be detected. The reference signal may for instance be the differential measurement signal that is expected upon occurrence of a fault. Regardless, the fault protection system is also configured to perform fault detection, for detecting a fault internal to a fault protection zone, as a function of the fault detection signal.

In some embodiments, the differential measurement signal indicates, as a function of time, the difference between currents or voltages measured at two or more terminals or boundaries of a fault protection zone of the electric power system. The reference signal in these and other embodiments may thereby characterize a change that is expected to occur over time in the difference between currents or voltages measured at the two or more terminals or boundaries upon occurrence of a fault internal to the fault protection zone. The change may for example be or include a step change, a ramp change, a sinusoidal change, and/or an exponential change.

In any event, the fault protection system in some embodiments may detect a fault internal to the fault protection zone if a magnitude of the fault detection signal exceeds a detection threshold. In other embodiments, the fault protection system may alternatively or additionally compare the fault detection signal with an expected fault detection signal that is expected upon occurrence of a fault internal to the fault protection zone. The expected fault detection signal may for example be or include a triangular pulse. Regardless, the fault protection system in this case may perform fault detection as a function of the comparison.

The differential measurement signal in some embodiments indicates, as a function of time, the difference between residual currents or residual voltages measured at the two or more terminals or boundaries of the fault protection zone. In other embodiments, the differential measurement signal is a phase-specific differential measurement signal that indicates, as a function of time, the difference between currents or voltages measured for a specific phase at the two or more terminals or boundaries of the fault protection zone.

In some embodiments, the differential measurement signal is just one of multiple differential measurement signals on which fault detection is based. For example, in some embodiments, the fault protections system obtains, for each of multiple phases, a phase-specific differential measurement signal that indicates, as a function of time and for that phase, the difference between currents or voltages measured at the two or more terminals or boundaries of the fault protection zone. The fault protection system may then generate, for each of the multiple phases, a phase-specific fault detection signal by cross-correlating the phase-specific differential measurement signal for that phase with a reference signal (which may be the same or different for the different phases). The fault protection system may perform fault detection as a function of these phase-specific fault detection signals.

Regardless, the fault protection system in some embodiments may, based on the fault detection performed, control a fault isolation device that removes the faulted equipment or location from the electric power system. The fault protection system may for example trip the fault isolation device upon detecting a fault. Alternatively or additionally, the fault protection system may, based on the fault detection detecting occurrence of a fault internal to the fault protection zone, send a fault notification signal that indicates occurrence of the fault.

Embodiments herein further include a corresponding method, computer program, and computer program product for implementing the processing described above for the fault protection system.

Of course, the present invention is not limited to the above features and advantages. Those of ordinary skill in the art will recognize additional features and advantages upon reading the following detailed description, and upon viewing the accompanying drawings.

DETAILED DESCRIPTION

Figure 1:
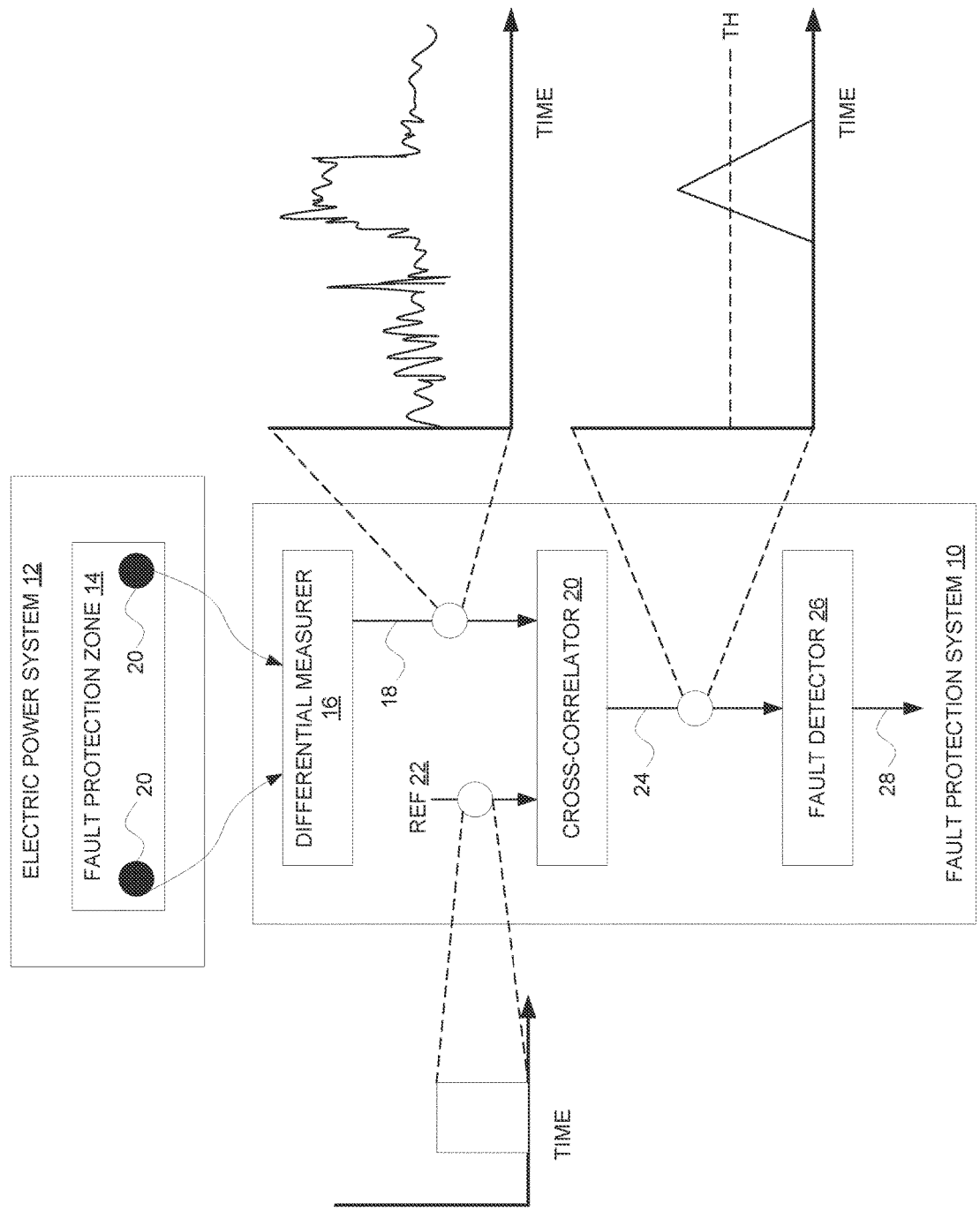
FIG. 1 is a block diagram of a fault protection system for fault protection of an electric power system according to some embodiments.

FIG. 1 shows a fault protection system 10 according to some embodiments. The fault protection system 10 is configured to detect a fault in an electric power system 12, e.g., a power generation, distribution, and/or transmission system. In particular, the fault protection system 10 is configured to detect a fault internal to a fault protection zone 14 of the electric power system 12.

The fault protection system 10 as shown includes a differential measurer 16, e.g., in the form of differential measurement circuitry. The differential measurer 16 is configured to obtain a differential measurement signal 18. The differential measurement signal 18 in some embodiments indicates, as a function of time, the difference between currents or voltages measured at two or more terminals or boundaries 20 of the fault protection zone 14. For example, in some embodiments involving two terminals 20, the differential measurement signal 18 may indicate, as a function of time, the difference between a current measured at one terminal 20 and a current measured at the other terminal 20. The difference in these and other cases may effectively amount to what is left after summing the currents or voltages going into or out of the fault protection zone 14, e.g., such that the differential measurement signal 18 represents how that difference changes over time. In some embodiments where the differential measurement signal 18 indicates this difference in terms of currents, the differential measurement signal 18 may be a phasor or instantaneous summation of current flows into the fault protection zone 14, e.g., a summation of measurements from the terminals of a transmission or distribution line. In this case, phasor or instantaneous summation of current flows normally is a small or zero value but will increase in proportion to fault current when a short circuit occurs.

In some embodiments, the differential measurer 16 itself measures at least some of the currents or voltages at the two or more terminals or boundaries 20 in order to obtain the differential measurement signal 18. In other embodiments, the differential measurer 16 receives measurements of the currents or voltages at the two or more terminals or boundaries 20 from other equipment, and then derives the differential measurement signal 18 from the received measurements. In still other embodiments, the differential measurer 16 receives the differential measurement signal 18 itself from other equipment (not shown).

No matter how the differential measurer 16 obtains the differential measurement signal 18, the fault protection system 10 further includes a cross-correlator 20, e.g., in the form of cross-correlation circuitry. The cross-correlator 20 cross-correlates the differential measurement signal 18 with a reference signal 22, e.g., over a correlation window that spans a maximum possible duration of a fault to be detected. In some embodiments, the reference signal 22 is the differential measurement signal that is expected upon occurrence of a fault internal to the fault protection zone 14. In these and other embodiments, then, the reference signal 22 may characterize a change that is expected to occur over time in the difference between currents or voltages measured at the two or more terminals or boundaries 20 upon occurrence of a fault internal to the fault protection zone 14. Such change may be or include a step change, a ramp change, a sinusoidal change, and/or an exponential change, as a few examples. FIG. 1 for instance shows the reference signal 22 as characterizing a step change, Regardless of the particular nature of the reference signal 22, the stronger the time-domain correlation between the differential measurement signal 18 and the reference signal 22, the greater the likelihood that a fault has occurred. In some sense, then, the cross-correlation performed by the cross-correlator 20 amounts to fault waveform function versus reference function cross-correlation.

In any event, the cross-correlator 20 generates a fault detection signal 24 as the output of, or as a function of, the cross-correlation between the differential measurement signal 18 and the reference signal 22. FIG. 1 for instance shows the fault detection signal 24 as being a triangular pulse over time.

The fault protection system 10 further includes a fault detector 26, e.g., in the form of fault detection circuitry. The fault detector 26 performs fault detection, for detecting a fault internal to the fault protection zone 14, as a function of the fault detection signal 24. For example, in some embodiments, the fault detector 26 detects a fault internal to the fault protection zone 14 if a magnitude of the fault detection signal 24 exceeds a detection threshold, e.g., TH as shown in FIG. 1. In one such embodiment, the magnitude must exceed the detection threshold for at least a threshold amount of time.

Alternatively or additionally, as another example, the fault detector 26 may compare the fault detection signal 24 with an expected fault detection signal that is expected upon occurrence of a fault internal to the fault protection zone 14, e.g., where the expected fault detection signal may be a triangular pulse. In this case, the fault detector 26 performs fault detection as a function of that comparison, e.g., so as to detect a fault if the comparison indicates the fault detection signal 24 is similar to the expected fault detection signal at least to a certain extent.

For instance, the comparison in some embodiments involves taking samples of the expected fault detection signal, multiplying each sample by a respective sample of the fault detection signal 24 in a window, and then summing the resulting products. The window may then be moved sample by sample, as new process sample sets come in over time, and the comparison repeated. The sequence of summation values will jump in value if the shape of the incoming sample changes match the shape of the expected fault detection signal. Imperfect matches show up as lesser jumps. No changes or other types of changes show up as an unchanging sequence of summation values, or as variations not showing the expected jump in value.

In any event, based on the fault detection performed by the fault detector 26, the fault protection system 10 in some embodiments controls a fault isolation device (not shown) that disconnects the electric power system 12 from a fault, e.g., by deenergizing and/or isolating the faulted segment of the power system. The fault isolation device may for instance be a circuit breaker. In some embodiments as shown, for example, fault detection performed by the fault detector 26 produces a fault detection decision or metric 28 that indicates whether or not the fault detector 26 detects a fault. In this case, the fault protection system 10 may control the fault isolation device using or as a function of the fault detection decision or metric 28.

Alternatively or additionally, the fault protection system 10 may be used in conjunction with other fault detection measurements and/or logical and sequence processing to yield a decision of whether or not to operate a fault isolation device for isolating the faulted segment. In some embodiments, for example, existing legacy protection functions, such as overcurrent relaying, may operate in parallel with cross-correlation embodiments herein, with the fault isolation device being triggered if any of the mechanisms detect a fault.

Alternatively or additionally, the fault protection system 10 may send a fault notification signal to indicate occurrence of a detected fault. The fault notification signal may for instance alert electric power system personnel of the detected fault, so that actions may be taken to address the fault.

Consider now additional details about the nature of the differential measurement signal 18. The currents or voltages that form the basis for the differential measurement signal 18 may be any type of currents or voltages. The currents or voltages may for example be instantaneous waveform measurements, or may be measurements extracted from these instantaneous values. For example, the currents or voltages may be power-frequency phasor measurements of magnitude and angle extracted by Fourier transform or other mathematical transform from the instantaneous waveform values.

Figure 2A:
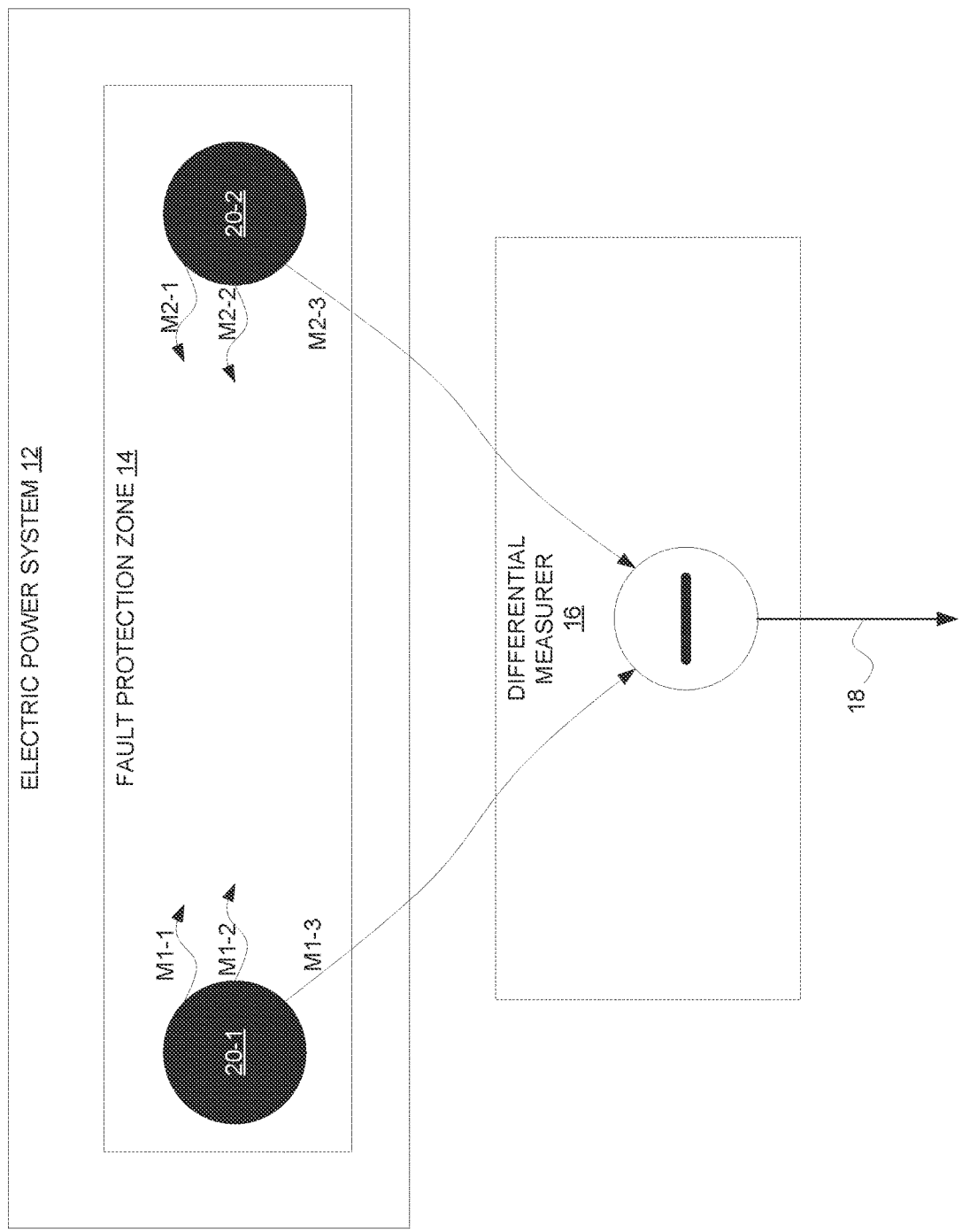
FIG. 2A is a block diagram of a differential measurer for obtaining a differential measurement signal in the form of a phase-specific differential measurement signal according to some embodiments.

Furthermore, in addition to the selection of the type of waveform measurements to be used, there are selections for which power system quantities are to be used for application of embodiments herein. For example, the currents or voltages may be phase-specific currents or voltages, i.e., so as to be specific to a certain alternating current (AC) phase. In this case, the differential measurement signal 18 is a phase-specific differential measurement signal that indicates, as a function of time, the difference between currents or voltages measured for a specific phase at the two or more terminals or boundaries 20 of the fault protection zone 14. FIG. 2A illustrates one example of these embodiments.

As shown in FIG. 2A, phase-specific measurements M1-1, M1-2, and M1-3 represent currents or voltages measured respectively for $1^{st}$, $2^{nd}$, and $3^{rd}$ phases at a first terminal or boundary 20-1 of the fault protection zone 14. Likewise, phase-specific measurements M2-1, M2-2, and M2-3 represent currents or voltages measured respectively for the $1^{st}$, $2^{nd}$, and $3^{rd}$ phases at a second terminal or boundary 20-2 of the fault protection zone 14. In this example, the differential measurer 16 obtains the phase-specific measurements M1-3 and M2-3 which represent currents or voltages measured for the $3^{rd}$ phase at the first and second terminals or boundaries 20-1, 20-2. The differential measurer 16 computes the difference between these currents or voltages for the $3^{rd}$ phase, as represented by the phase-specific measurements M1-3 and M2-3, in order to obtain the differential measurement signal 18 in the form of a phase-specific differential measurement signal. The differential measurement signal 18 in FIG. 2A thereby indicates, as a function of time, the difference between currents or voltages measured for the $3^{rd}$ phase at the terminals or boundaries 20-1, 20-2 of the fault protection zone 14.

Figure 2B:
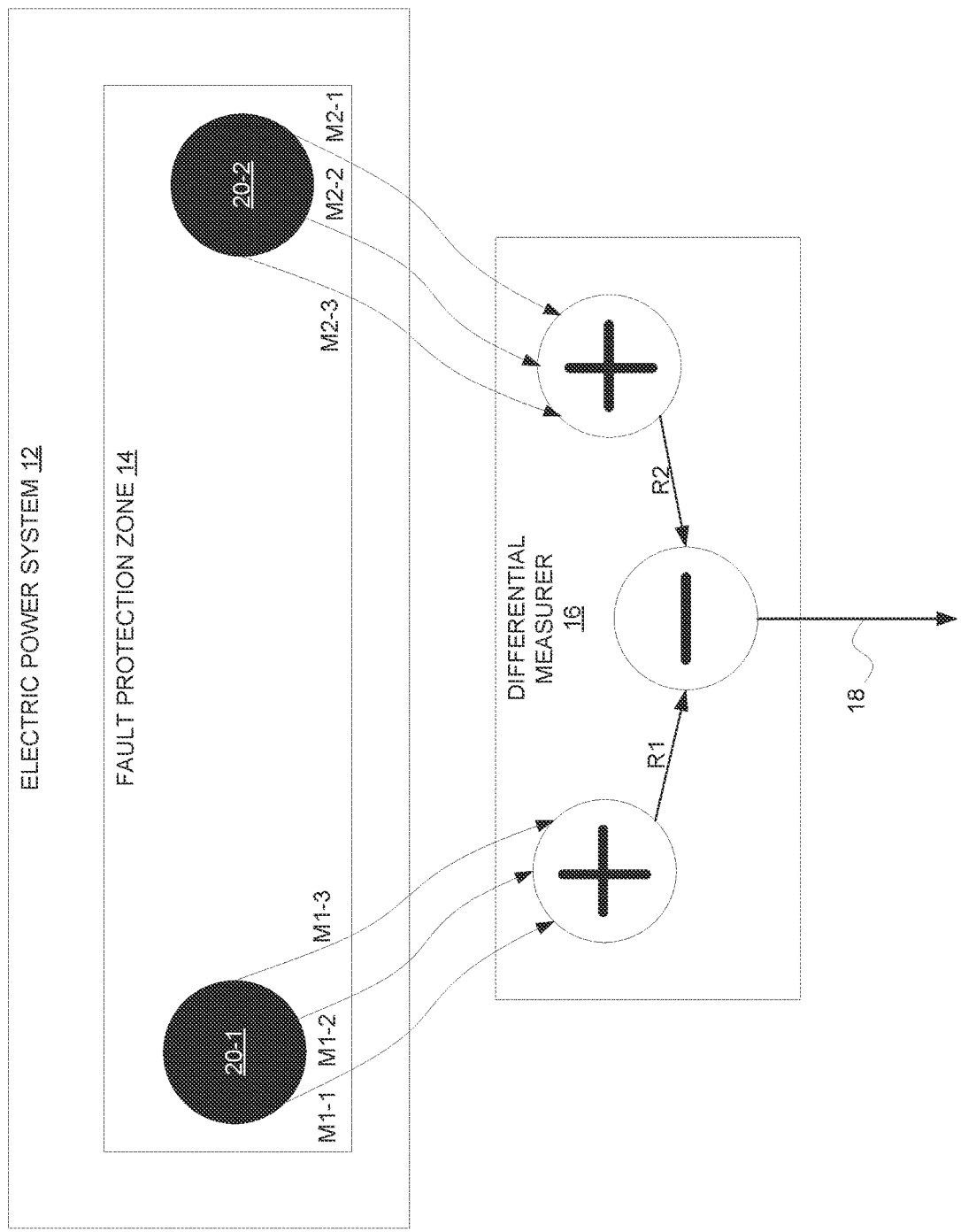
FIG. 2B is a block diagram of a differential measurer for obtaining a differential measurement signal in the form of a differential residual measurement signal according to some embodiments.

As another example, the currents or voltages may be residual currents or residual voltages. A residual current measured at a certain terminal or boundary 20 may be understood as the instantaneous sum of multiple phase-specific currents measured at that certain terminal or boundary 20, e.g., in terms of the sum of synchronized measurement or synchrophasor values for multiple phases. Similarly, a residual voltage measured at a certain terminal or boundary 20 may be understood as the instantaneous sum of multiple phase-specific voltages measured at that certain terminal or boundary 20, e.g., in terms of the sum of synchronized measurement or synchrophasor values for multiple phases. Generally, then, the differential measurement signal 18 in some embodiments may indicate, as a function of time, the difference between residual currents or residual voltages measured at the two or more terminals or boundaries 20 of the fault protection zone 14. A differential measurement signal that indicates the difference between residual currents measured at the two or more terminals or boundaries 20 may be referred to herein as a differential residual current measurement signal, whereas a differential measurement signal that indicates the difference between residual voltages measured at the two or more terminals or boundaries 20 may be referred to herein as a differential residual voltage measurement signal. FIG. 2B illustrates one example of these embodiments.

As shown in FIG. 2B, the differential measurer 16 obtains the instantaneous sum of the phase-specific measurements M1-1, M1-2, and M1-3 (which represent currents or voltages measured respectively for the $1^{st}$, $2^{nd}$, and $3^{rd}$ phases at the first terminal or boundary 20-1 of the fault protection zone 14). The result of this instantaneous sum is a residual current or voltage R1 for the first terminal or boundary 20-1. The differential measurer 16 also obtains the instantaneous sum of the phase-specific measurements M2-1, M2-2, and M2-3 (which represent currents or voltages measured respectively for the $1^{st}$, $2^{nd}$, and $3^{rd}$ phases at the second terminal or boundary 20-2 of the fault protection zone 14). The result of this other instantaneous sum is a residual current or voltage R2 for the second terminal or boundary 20-2. The differential measurer 16 then computes the difference between the residual current or voltage R1 for the first terminal or boundary 20-1 and the residual current or voltage R2 for the second terminal or boundary 20-2, in order to obtain the differential measurement signal 18 in the form of a differential residual measurement signal. The differential measurement signal 18 in FIG. 2B thereby indicates, as a function of time, the difference between residual currents or voltages measured at the terminals or boundaries 20-1, 20-2 of the fault protection zone 14.

Note, though, that the currents or voltages that form the basis for the differential measurement signal 18 are not raw current or voltage instantaneous sample values. Instead, in some embodiments, the currents or voltages that form the basis for the differential measurement signal 18 are synchrophasor current or voltage measurements, e.g., as extracted by phasor measurement units (PMUs) at the terminals or boundaries 20 and/or as computed by discrete Fourier transform (DFT) processing. In one or more embodiments, then, the differential measurement signal 18 indicates, as a function of time, the difference between synchrophasor currents or voltages (e.g., DFT-computed magnitude and angle measurements of currents or voltages) measured at the two or more terminals or boundaries 20 of the fault protection zone 14. In these embodiments, the fault protection system 10 may effectively detect buried evidence of a fault that would not otherwise be readily detectable by observing the DFT-computed magnitude and angle measurements alone. The fault protection system 10 in particular uncovers a subtle change in the outputs of the differential DFT phasor calculated values by comparing it with the shape of the change produced by a fault, e.g., looking for a congruent or similarly-shaped change.

Note further that, although FIG. 1 shows fault detection as being performed based on a single differential measurement signal 18, the differential measurement signal 18 shown may be just one of multiple differential measurement signals based on which fault detection is performed.

Figure 3A:
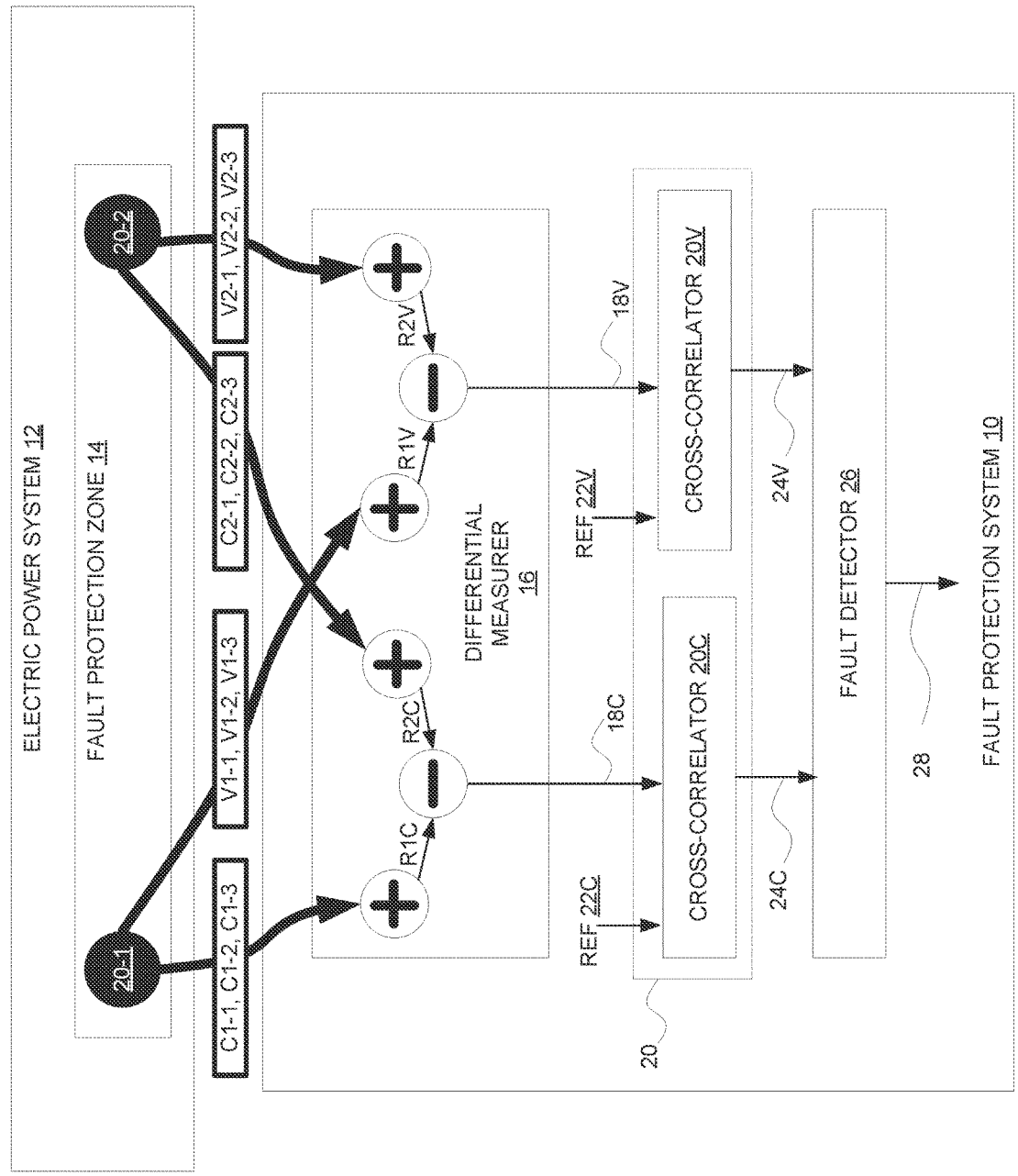
FIG. 3A is a block diagram of a differential measurer for obtaining a differential current measurement signal as well as a differential voltage measurement signal, for generating multiple fault detection signals, according to some embodiments.

In some embodiments, for example, fault detection may be performed based on multiple differential measurement signals, one relating to currents and another relating to voltages. That is, one differential measurement signal may be a differential current measurement signal that indicates, as a function of time, the difference between currents measured at the two or more terminals or boundaries 20. And another differential measurement signal may be a differential voltage measurement signal that indicates, as a function of time, the difference between voltages measured at the two or more terminals or boundaries 20. In this case, the fault detector 26 may cross-correlate the differential current measurement signal with a reference current signal and cross-correlate the differential voltage measurement signal with a reference voltage signal, resulting in multiple fault detection signals, one for current and one for voltage. The fault detector 26 may correspondingly perform fault detection as a function of these fault detection signals. For example, the fault detector 26 may detect a fault if at least one of the fault detection signals indicates occurrence of a fault. FIG. 3A illustrates one example of these embodiments.

As shown in FIG. 3A, the differential measurer 16 obtains the instantaneous sum of phase-specific current measurements C1-1, C1-2, and C1-3 measured at the first terminal or boundary 20-1, resulting in a residual current R1C for the first terminal or boundary 20-1. The differential measurer 16 also obtains the instantaneous sum of phase-specific current measurements C2-1, C2-2, and C2-3 measured at the second terminal or boundary 20-2, resulting in a residual current R2C for the second terminal or boundary 20-2. The differential measurer 16 then computes the difference between the residual current R1C for the first terminal or boundary 20-1 and the residual current R2C for the second terminal or boundary 20-2, in order to obtain one differential measurement signal 18 in the form of a differential residual current measurement signal 18C. This differential residual current measurement signal 18C thereby indicates, as a function of time, the difference between residual currents measured at the terminals or boundaries 20-1, 20-2 of the fault protection zone 14.

The differential measurer 16 in FIG. 3A further obtains the instantaneous sum of phase-specific voltage measurements V1-1, V1-2, and V1-3 measured at the first terminal or boundary 20-1, resulting in a residual voltage R1V for the first terminal or boundary 20-1. The differential measurer 16 also obtains the instantaneous sum of phase-specific voltage measurements V2-1, V2-2, and V2-3 measured at the second terminal or boundary 20-2, resulting in a residual voltage R2V for the second terminal or boundary 20-2. The differential measurer 16 then computes the difference between the residual voltage R1V for the first terminal or boundary 20-1 and the residual voltage R2V for the second terminal or boundary 20-2, in order to obtain another differential measurement signal 18 in the form of a differential residual voltage measurement signal 18V. This differential residual voltage measurement signal 18V thereby indicates, as a function of time, the difference between residual voltages measured at the terminals or boundaries 20-1, 20-2 of the fault protection zone 14.

In this example, the fault protection system 10 includes one cross-correlator 20C that cross-correlates the differential residual current measurement signal 18C with a reference current signal 220, resulting in a fault detection signal 24C for current. And the fault protection system 10 further includes another cross-correlator 20V that cross-correlates the differential residual voltage measurement signal 18B with a reference voltage signal 22V, resulting in another fault detection signal 24V, this time for voltage. The fault detector 26 correspondingly performs fault detection as a function of these fault detection signals 24C, 24V, e.g., by detecting a fault if at least one of the fault detection signals 24C, 24V indicates occurrence of a fault.

Figure 3B:
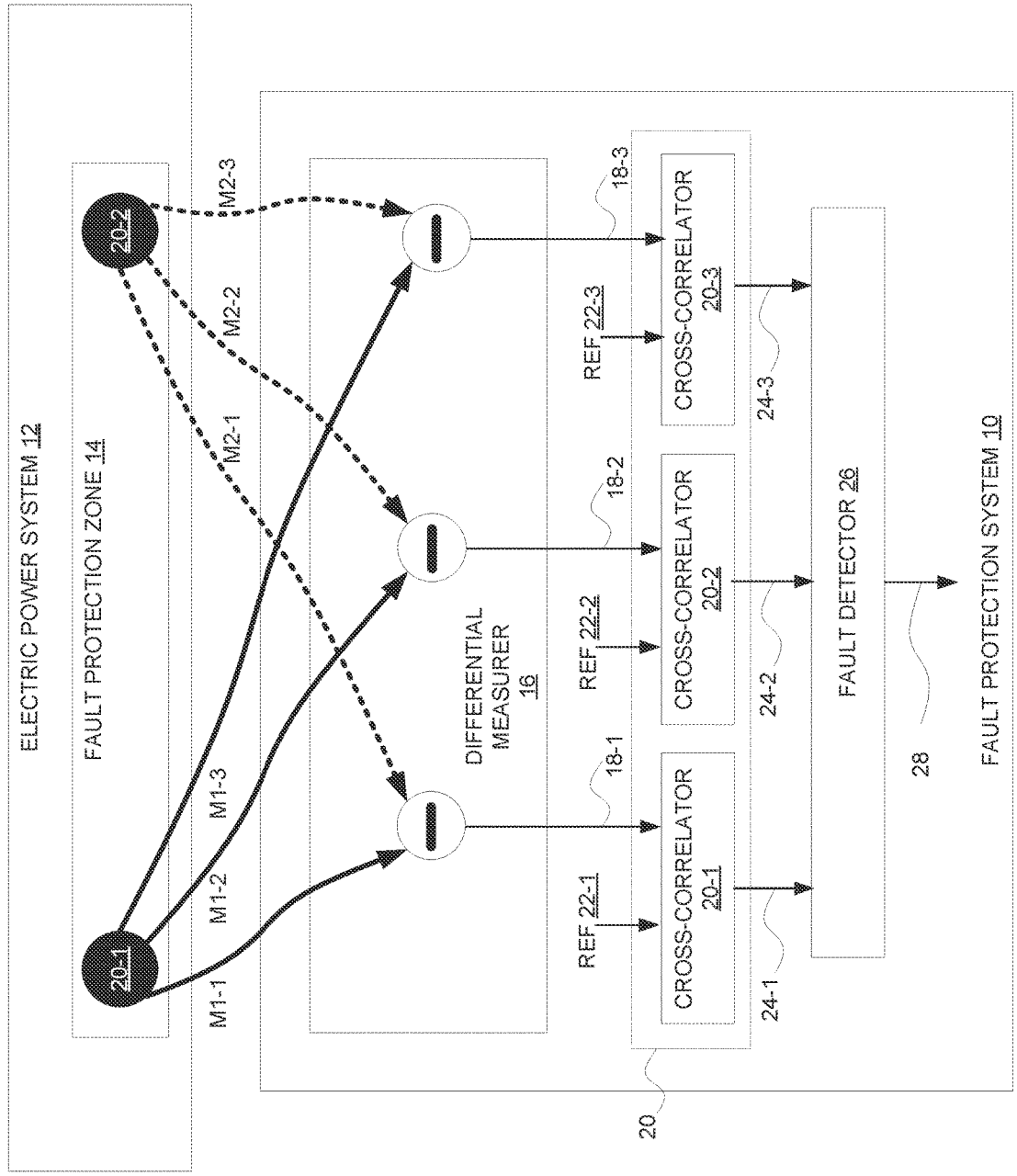
FIG. 3B is a block diagram of a differential measurer for obtaining multiple phase-specific differential measurement signals, for generating multiple phase-specific fault detection signals, according to some embodiments.

In other embodiments, fault detection may be performed based on multiple differential measurement signals, one for each of multiple phases, where each differential measurement signal is as described above in FIG. 2A with respect to differential measurement signal 18 but is specific to a respective one of the multiple phases. In this case, then, the differential measurer 16 may obtain, for each of multiple phases, a phase-specific differential measurement signal that indicates, as a function of time and for that phase, the difference between currents or voltages measured at the two or more terminals or boundaries 20 of the fault protection zone 14. The cross-correlator 20 may then generate, for each of the multiple phases, a phase-specific fault detection signal by cross-correlating the phase-specific differential measurement signal for that phase with a reference signal (which may be the same or different for different phases). This results in multiple phase-specific fault detection signals, one for each phase. The fault detector 26 may correspondingly perform fault detection as a function of the phase-specific fault detection signals. For example, the fault detector 26 may detect a fault if at least one of the phase-specific fault detection signals indicates occurrence of a fault. FIG. 3B illustrates one example of these embodiments.

As shown in FIG. 3B, the differential measurer 16 obtains phase-specific measurements M1-1 and M2-1 which represent currents or voltages measured for the $1^{st}$ phase at the first and second terminals or boundaries 20-1, 20-2. The differential measurer 16 computes the difference between these currents or voltages for the $1^{st}$ phase, as represented by the phase-specific measurements M1-3 and M2-3, in order to obtain a phase-specific differential measurement signal 18-1. Similarly, the differential measurer 16 obtains phase-specific measurements M1-2 and M2-2 which represent currents or voltages measured for the $2^{nd}$ phase at the first and second terminals or boundaries 20-1, 20-2. The differential measurer 16 computes the difference between these currents or voltages for the $2^{nd}$ phase, as represented by the phase-specific measurements M1-2 and M2-2, in order to obtain another phase-specific differential measurement signal 18-2. Furthermore, the differential measurer 16 also obtains phase-specific measurements M1-3 and M2-3 which represent currents or voltages measured for the $3^{rd}$ phase at the first and second terminals or boundaries 20-1, 20-2. The differential measurer 16 computes the difference between these currents or voltages for the $3^{rd}$ phase, as represented by the phase-specific measurements M1-3 and M2-3, in order to obtain still another phase-specific differential measurement signal 18-3.

The fault protection system 10 as shown includes one cross-correlator 20-1 that cross-correlates the phase-specific differential measurement signal 18-1 for the $1^{st}$ phase with a reference signal 22-1, resulting in a phase-specific fault detection signal 24-1 for the $1^{st}$ phase. The fault protection system 10 also includes another cross-correlator 20-2 that cross-correlates the phase-specific differential measurement signal 18-2 for the $2^{nd}$ phase with a reference signal 22-2, resulting in a phase-specific fault detection signal 24-2 for the $2^{nd}$ phase. And the fault protection system 10 further includes still another cross-correlator 20-3 that cross-correlates the phase-specific differential measurement signal 18-3 for the $3^{rd}$ phase with a reference signal 22-3, resulting in a phase-specific fault detection signal 24-3 for the $3^{rd}$ phase.

The fault detector 26 may correspondingly perform fault detection as a function of these phase-specific fault detection signals 24-1, 24-2, and 24-3. For example, the fault detector 26 may detect a fault if at least one of the phase-specific fault detection signals 24-1, 24-2, and 24-3 indicates occurrence of a fault.

In still other embodiments, such as those based on the combination of FIGS. 2A and 2B, the combination of FIGS. 2A and 3A, or the combination of FIGS. 3A and 3B, fault detection may be performed based on multiple differential measurement signals, one differential measurement signal relating to residual currents or residual voltages and at least one other differential measurement signal being a phase-specific differential measurement signal. That is, one differential measurement signal indicates, as a function of time, the difference between residual currents or residual voltages measured at the two or more terminals or boundaries 20 of the fault protection zone 14. And at least one other differential measurement signal indicates as a function of time, the difference between currents or voltages measured for a specific phase at the two or more terminals or boundaries 20 of the fault protection zone 14. In this case, the cross-correlator 20 may generate one fault detection signal from the differential measurement signal relating to residual currents or voltages and at least one, phase-specific fault detection signal from the phase-specific differential measurement signal(s). The fault detector 26 may then perform fault detection based on all fault detection signals. For example, the fault detector 26 may detect a fault if the fault detection signal generated from the differential measurement signal relating to residual currents or voltages and at least one of the phase-specific fault detection signals each indicate occurrence of a fault internal to the fault protection zone 14, e.g., at the same time.

Generally, then, embodiments herein may exploit any combination of the different types of differential measurement signals disclosed herein. For example, embodiments herein may exploit (i) one or more differential current measurement signals, e.g., for one or more phases; (ii) one or more differential voltage measurement signals, e.g., for one or more phases; (iii) a differential residual current measurement signal; (iv) a differential residual voltage measurement signal; or (v) any combination of (i), (ii), (iii), and/or (iv).

In some embodiments, the fault protection system 10 is implemented by one or more processing circuits (e.g., one or more microprocessors or digital signal processors, DSPs) of a microprocessor relay, or other logic and computing platform such as a real-time automation controller. In other embodiments, the fault protection system 10 may be implemented by a networked application server computer connected to a super or lower-level phasor data concentrator (PDC).

In view of the above, some embodiments herein generally apply cross-correlation mathematical computations to electrical measurements (e.g., from three phases) and the residual or phase-summation values from the electric power system 12 to detect a change of value that is obscured by the noise of routine random measurement variations. This general type of measurement correlates noise-obscured changes or signals with a reference change or signal function. Examples of reference functions include a unit step function, a specific sinusoidal or exponential function, or other mathematical function that describes what the newly appearing signal should look like in the absence of noise or random variation that is obscuring it.

Figure 4:
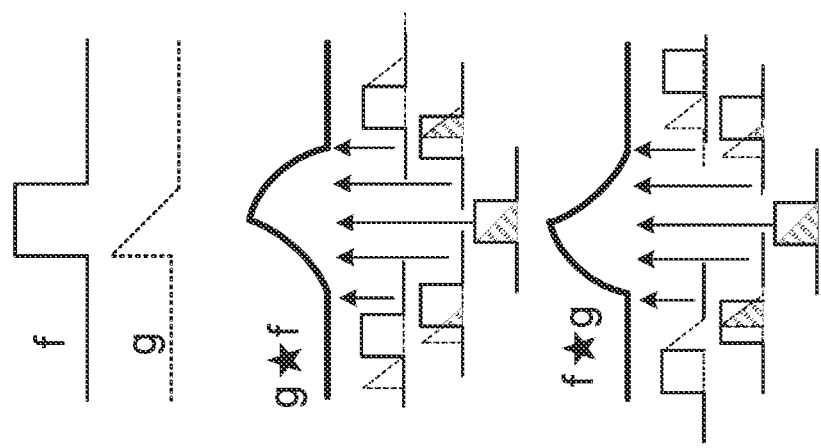
FIG. 4 is a block diagram illustrating cross-correlation according to some embodiments.

FIG. 4 shows the mathematical results of cross-correlation calculations that can give an impulse indication over time that a particular anticipated waveform is buried in the analyzed noisy signal.

Some embodiments use the cross-correlation calculation between a step function representing a unit step increase of envelope magnitude, and the magnitude value of residual or phase synchrophasor differential currents. This contrasts with discrete Fourier transform (DFT) filtering methods in conventional relays that are, in effect, utilizing the cross-correlation of raw waveform samples with reference power frequency sine and cosine waves over a time window of samples—for example over one or over three power cycles. Low-current, high-impedance ground faults that cannot be detected by a simple threshold comparison are expected to yield a triangle-wave impulse spanning the alignment of the incoming change signal with the reference function.

Some embodiments herein may be performed on real-time streams of voltage or current measurements from protected electric power apparatus or system sections, e.g., fault protection zone 14. Synchrophasors comprise a particular implementation of the DFT with time-synchronized sampled data. The resulting magnitude (or phase) envelope can be subjected to further correlation as described above, e.g., by cross-correlator 20.

Consider now a concrete example of some embodiments herein. This example will use the cross-correlation or covariance calculation between a step function and the magnitude value of residual or phase synchrophasor currents to detect a low-current, high-impedance ground fault that cannot be detected by a simple threshold comparison.

IRN(t) represents the differential residential current measurement signal 18 as the differential of the sums of the three-phase current synchrophasors from two or more line terminals of the fault protection zone 14 at a time t. If a low-current ground fault occurs, it will yield a ragged step change in the average value of the magnitudes of the differential residual current IRN(t) for successive checking times t=0, 1, 2, etc. The low-current ground fault signal is obscured by noisy variations of phasor values of IRN(t), so that a simple comparison with a detection threshold cannot be used to recognize the change and make a tripping decision.

The sequence of IRN(t) phasor magnitudes is cross-correlated with the reference signal 22 in the form of a simple unit step function by multiplication and summation over the window of examination, for example 3 to 10 power cycles. As the fault inception slides into alignment with the reference signal 22, the covariance function will peak, and then will decline again as the fault window slides out of alignment over time. The peak is subjected to a threshold check for whether the differential IRN(t) change could be a fault. The indication is necessarily a triangular pulse following the moment of the fault change, as opposed to the sustained indication that one could observe with higher fault current. The crossing of the detection threshold is used to issue a trip and latch the event occurrence indicator.

The degree of filtering and sensitivity from the cross-correlation calculation is a function of the width of the time window used for the cross-correlation calculation. Some embodiments filter out the magnitude value variations and expose the step change, while not making the window so long that creeping variations of value outside the fault moment confuse the result. A window of 3 to 10 power cycles or phasor values may be used in some embodiments.

Some embodiments also use an additional security check comprising the simultaneous cross-correlation of the individual phase differential currents (the differential of terminal current values for each phase) with the reference step function, looking for one phase in particular showing a triangular peak aligned with that from the response of the IRN(t) to the step. That would identify the faulted phase and help confirm that this is a fault.

Consider a simple example to illustrate some embodiments. For an example window of 8 power cycles and one P-Class synchrophasor magnitude per power cycle (60 phasor frames per second), the reference unit step function R(t) with a window of 8 cycles has the series of eight values −1, −1, −1, −1, 1, 1, 1, 1 going from the furthest time back to the present time. In other words R(t−7)=−1 and R(t)=1.

If the just received and most recent value of the differential residual current magnitude is IRN(t), the last eight magnitude values are available in the rolling file of data that updates as each new value arrives in real time. Call the newest and seven next older values IRN(t), IRN(t−1), IRN(t−2), . . . , IRN(t−7).

Cross-multiply each of the eight values of the reference step function over time with its respective IRN(t) value, and sum the eight products to obtain the value of the fault detection signal magnitude S at time t:

$$S(t) = K^* \Sigma_{t=-7}^{t=0}(R(t)*IRN(t))$$

where K is a scaling constant that is taken as 1 here.

$$S(t) = -IRN(t-7) - IRN(t-6) - IRN(t-5) - IRN(t-4) + IRN(t-3) + IRN(t-2) + IRN(t-1) + IRN(t)$$

S(t) is then stored in the time sequence of values for S, where S exemplifies the fault detection signal 24 in FIG. 1.

Each time a new incoming sample arrives, the window moves forward by one sample and the calculation of S(t) is repeated.

If the IRN(t) current magnitude is changing only gradually over time, the values of S(t) will be approximately zero.

If a step change occurs in the value of IRN(t), even if small, the near-zero value of S(t) will begin to increase until the step change of the reference (between t−4 and t−3) is aligned with the step change of IRN(t). The value of S(t) will then decline as the step of IRN(t) moves out of the window. The resulting triangle-wave sequence is subjected to a peak magnitude check, or else compared to a reference threshold triangle for a more careful check, to determine if the step magnitude corresponds to a possible low-level ground fault.

In some embodiments, the fault protection system 10 further includes a change detector that implements supervision for phase currents or line voltages so that major change events like line energization or sudden large load increases do not trigger a fault trip response.

Different time windows from 3 to 10 or 20 cycles can be used, depending on the desired result. The tradeoff is degree of noise filtering and detection sensitivity versus slow trip decisions. Overly long windows may be less helpful because of instability of arcing ground fault current.

Alternatively or additionally to a step change, the reference signal 22 in other embodiments may be a unit ramp (e.g., of 3 cycles) with constant step-like values before and after the ramp. In some embodiments, there is an odd number of samples in the window, and for the example of a 7 cycle window some embodiments may use the R(t) sequence −1, −1, −1, 0, 1, 1, 1. This may better fit the fault appearance function considering the time response of the DFT in the PMU-relay to a step-change fault. Other embodiments use a longer ramp for the reference signal 22, such as the nine-sample sequence −2, −2, −2, −1, 0, 1, 2, 2, 2, 2. Generally, the reference signal 22 may use greater number resolution and may closely replicate the step response of the PMU-relay DFT calculation, e.g., which can be observed in a laboratory test. In a real-time programmable automation controller platform, there is no penalty of note for using real number multiplications instead of just changing signs as one multiplies by −1.

Ultimate performance in some embodiments depends on the resolution capabilities of the PMU relay. For example, some embodiments that use a step change refence signal detect occurrence of a 25,000 ohm fault upon detecting a magnitude change of 5 or 10 counts in the binary value.

Some embodiments may be implemented, as an example, using Transmission Line Falling Conductor (TFCP) 87LN protection on a section of a 69 kV transmission system. A real-time programmable automation controller, fed by PIM relays, may record synchrophasor streams. Correlation is performed in real time on real-time programmable automation controller incoming data streams.

Figure 5:
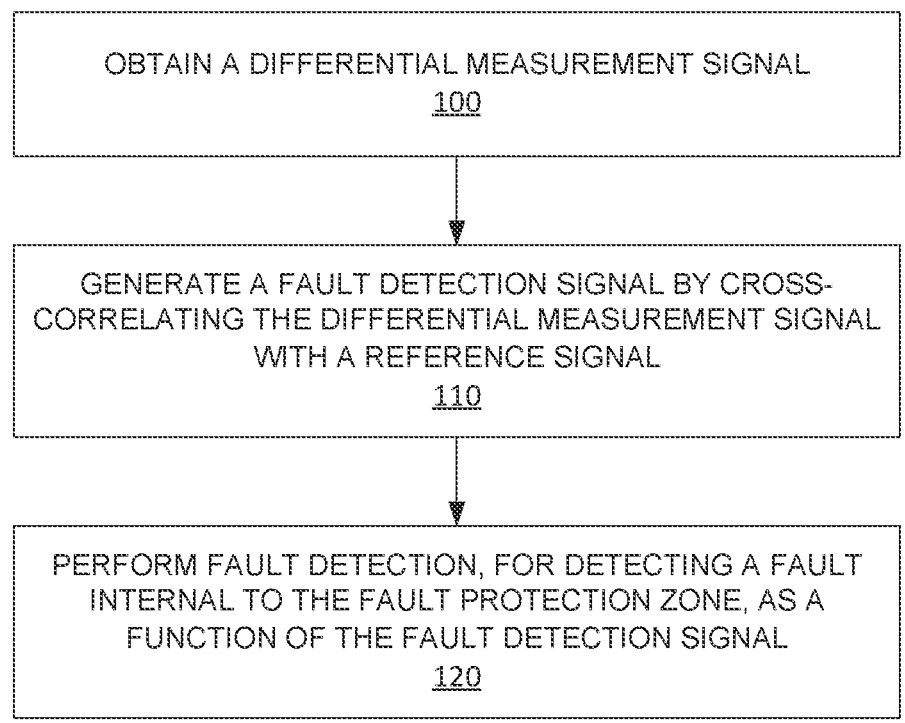
FIG. 5 is a logic flow diagram of a method performed by a fault protection system according to some embodiments.

In view of the above modifications and variations, FIG. 5 shows a method performed by a fault protection system 10 according to some embodiments. As shown, the method comprises obtaining a differential measurement signal 18 (Block 100). In some embodiments, the differential measurement signal 18 indicates, as a function of time, the difference between currents or voltages measured at two or more terminals or boundaries 20 of a fault protection zone 14 of an electric power system 12. In one or more such embodiments, the differential measurement signal 18 indicates, as a function of time, the difference between residual currents or residual voltages measured at the two or more terminals or boundaries 20 of the fault protection zone 14. In one or more other embodiments, the differential measurement signal 18 is a phase-specific differential measurement signal that indicates, as a function of time, the difference between currents or voltages measured for a specific phase at the two or more terminals or boundaries 20 of the fault protection zone 14.

In any event, the method further comprises generating a fault detection signal 24 by cross-correlating the differential measurement signal 18 with a reference signal 22 (Block 110). In some embodiments, the reference signal 22 is the differential measurement signal that is expected upon occurrence of a fault internal to the fault protection zone 14. Alternatively or additionally, the reference signal 22 may characterize a change (e.g., a step change) that is expected to occur over time in the difference between currents or voltages measured at the two or more terminals or boundaries 20 upon occurrence of a fault internal to the fault protection zone 14.

Regardless, the method further comprises performing fault detection, for detecting a fault internal to the fault protection zone 14, as a function of the fault detection signal 24 (Block 120). In some embodiments, for example, performing fault detection comprises detecting a fault internal to the fault protection zone 14 if a magnitude of the fault detection signal 24 exceeds a detection threshold.

Figure 6:
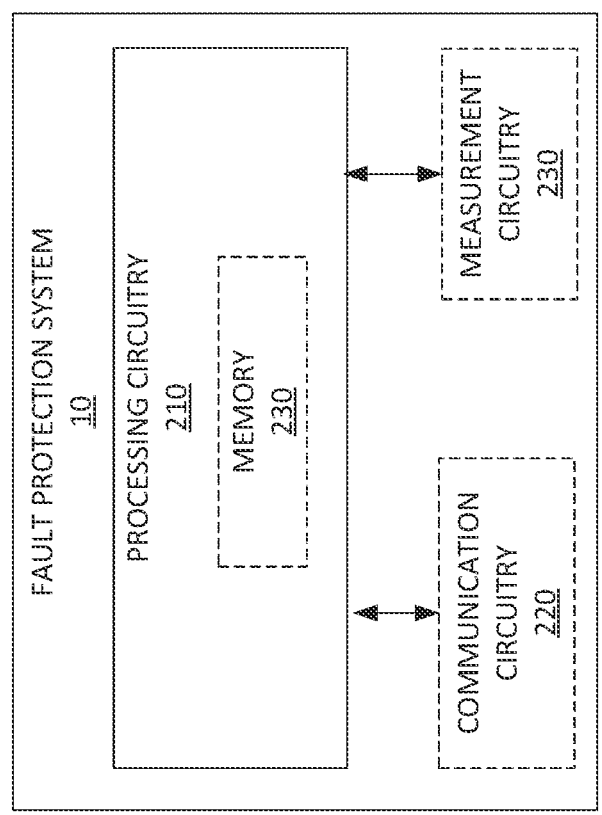
FIG. 6 is a block diagram of a fault protection system according to some embodiments.

FIG. 6 shows the fault protection system 10 as implemented according to some embodiments. As shown, the fault protection system 10 includes processing circuitry 210. The processing circuitry 210 may implement the differential measurer 16, the cross-correlator 20, and/or the fault detector 26 in FIG. 1, or may otherwise be configured to perform the method in FIG. 5. The processing circuitry 210 in some embodiments, for example, executes instructions stored in memory 230 such that the fault protection system 10 operates as described above.

In some embodiments, the fault protection system 10 further includes measurement circuitry 230. The measurement circuitry 230 may for instance measure at least some of the currents or voltages at the two or more terminals or boundaries 20. In this case, the measurement circuitry 230 may provide the measurements to the processing circuitry 210, in order for the processing circuitry 210 to obtain the differential measurement signal 18 from those measurements. Or, the measurement circuitry 230 may itself form the differential measurement signal 18 and the processing circuitry 210 may obtain the differential measurement signal 18 from the measurement circuitry 230.

In other embodiments, the fault protection system 10 alternatively or additionally includes communication circuitry 220. The communication circuitry 220 may for instance receive measurements of at least some of the currents or voltages at the two or more terminals or boundaries 20. In this case, the communication circuitry 220 may provide the measurements to the processing circuitry 210, in order for the processing circuitry 210 to obtain the differential measurement signal 18 from those measurements. Or, the communication circuitry 220 may receive the differential measurement signal 18 itself and the processing circuitry 210 may obtain the differential measurement signal 18 from the communication circuitry 220.

Generally, then, the fault protection system 10 described above may perform the methods herein and any other processing by implementing any functional means, modules, units, or circuitry. In one embodiment, for example, the fault protection system 10 comprises respective circuits or circuitry configured to perform the steps shown in FIG. 3. The circuits or circuitry in this regard may comprise circuits dedicated to performing certain functional processing and/or one or more microprocessors in conjunction with memory. For instance, the circuitry may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory, cache memory, flash memory devices, optical storage devices, etc. Program code stored in memory may include program instructions for executing instructions for carrying out one or more of the techniques described herein, in several embodiments. In embodiments that employ memory, the memory stores program code that, when executed by the one or more processors, carries out the techniques described herein.

Those skilled in the art will also appreciate that embodiments herein further include corresponding computer programs.

A computer program comprises instructions which, when executed on at least one processor of the fault protection system 10, cause the fault protection system 10 to carry out any of the respective processing described above. A computer program in this regard may comprise one or more code modules corresponding to the means or units described above.

Embodiments further include a carrier containing such a computer program. This carrier may comprise one of an electronic signal, optical signal, radio signal, or computer readable storage medium.

In this regard, embodiments herein also include a computer program product stored on a non-transitory computer readable (storage or recording) medium and comprising instructions that, when executed by a processor of the fault protection system 10, cause the fault protection system 10 to perform as described above.

Embodiments further include a computer program product comprising program code portions for performing the steps of any of the embodiments herein when the computer program product is executed by a computing device. This computer program product may be stored on a computer readable recording medium.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure, Although specific terms may be employed herein, they are used in a generic and descriptive sense only and not for purposes of limitation.

What is claimed is:

1. A method comprising:
obtaining a differential measurement signal that indicates, as a function of time, a difference between currents or voltages measured at two or more terminals or boundaries of a fault protection zone of an electric power system;
generating a fault detection signal by cross-correlating the differential measurement signal with a reference signal, wherein the reference signal is the differential measurement signal that is expected upon occurrence of a fault internal to the fault protection zone; and
performing fault detection, for detecting the fault internal to the fault protection zone, as a function of the fault detection signal.

2. The method of claim 1, wherein the reference signal characterizes a change that is expected to occur over time in the difference between currents or voltages measured at the two or more terminals or boundaries upon occurrence of the fault internal to the fault protection zone.

3. The method of claim 2, wherein said change is or includes a step change.

4. The method of claim 2, wherein said change is or includes a ramp change, a sinusoidal change, and/or an exponential change.

5. The method of claim 1, wherein performing fault detection comprises detecting the fault internal to the fault protection zone if a magnitude of the fault detection signal exceeds a detection threshold.

6. The method of claim 1, wherein performing fault detection comprises comparing the fault detection signal with an expected fault detection signal that is expected upon occurrence of the fault internal to the fault protection zone and performing fault detection as a function of said comparing.

7. The method of claim 6, wherein the expected fault detection signal is or includes a triangular pulse.

8. The method of claim 1, wherein the differential measurement signal indicates, as the function of time, the difference between residual currents or residual voltages measured at the two or more terminals or boundaries of the fault protection zone.

9. The method of claim 8, further comprising:
obtaining, for each of multiple phases, a phase-specific differential measurement signal that indicates, as a function of time and for that phase, the difference between currents or voltages measured at the two or more terminals or boundaries of the fault protection zone; and
generating, for each of the multiple phases, a phase-specific fault detection signal by cross-correlating the phase-specific differential measurement signal for that phase with the reference signal;
wherein performing fault detection comprises performing fault detection also as a function of the phase-specific fault detection signals.

10. The method of claim 9, wherein performing fault detection comprises detecting the fault if the fault detection signal and at least one of the phase-specific fault detection signals each indicate occurrence of the fault internal to the fault protection zone at the same time.

11. The method of claim 1, wherein the differential measurement signal is a phase-specific differential measurement signal that indicates, as a function of time, the difference between currents or voltages measured for a specific phase at the two or more terminals or boundaries of the fault protection zone, and wherein the fault detection signal is a phase-specific fault detection signal.

12. The method of claim 11, wherein said obtaining and generating is performed as part of:
obtaining, for each of multiple phases, a phase-specific differential measurement signal that indicates, as a function of time and for that phase, the difference between currents or voltages measured at the two or more terminals or boundaries of the fault protection zone; and
generating, for each of the multiple phases, a phase-specific fault detection signal by cross-correlating the phase-specific differential measurement signal for that phase with the reference signal;
wherein performing fault detection comprises performing fault detection as a function of the phase-specific fault detection signals.

13. The method of claim 1, wherein the differential measurement signal indicates, as the function of time, the difference between currents measured at the two or more terminals or boundaries of the fault protection zone.

14. The method of claim 1, further comprising:
based on the fault detection performed, controlling a protection device that protects the electric power system from the fault; and/or
based on the fault detection detecting occurrence of the fault internal to the fault protection zone, sending a fault notification signal that indicates occurrence of the fault.

15. The fault protection system of claim 1, wherein the differential measurement signal is a phase-specific differential measurement signal that indicates, as a function of time, the difference between currents or voltages measured for a specific phase at the two or more terminals or boundaries of the fault protection zone, and wherein the fault detection signal is a phase-specific fault detection signal.

16. The fault protection system of claim 15, wherein the processing circuitry is configured to obtain the differential measurement signal and generating the fault detection signal as part of:
obtaining, for each of multiple phases, a phase-specific differential measurement signal that indicates, as a function of time and for that phase, the difference between currents or voltages measured at the two or more terminals or boundaries of the fault protection zone; and
generating, for each of the multiple phases, a phase-specific fault detection signal by cross-correlating the phase-specific differential measurement signal for that phase with the reference signal;
wherein the one or more processing circuits are configured to perform fault detection as a function of the phase-specific fault detection signals.

17. The method of claim 1, wherein performing fault detection comprises deciding whether or not the fault internal to the fault protection zone has occurred based respectively on whether or not a magnitude of the fault detection signal exceeds a detection threshold.

18. A fault protection system for an electric power system, the fault protection system comprising:
processing circuitry configured to:
obtain a differential measurement signal that indicates, as a function of time, a difference between currents or voltages measured at two or more terminals or boundaries of a fault protection zone of the electric power system;

generate a fault detection signal by cross-correlating the differential measurement signal with a reference signal, wherein the reference signal is the differential measurement signal that is expected upon occurrence of a fault internal to the fault protection zone; and perform fault detection, for detecting the fault internal to the fault protection zone, as a function of the fault detection signal.

19. The fault protection system of claim 18, wherein the reference signal characterizes a change that is expected to occur over time in the difference between currents or voltages measured at the two or more terminals or boundaries upon occurrence of the fault internal to the fault protection zone.

20. The fault protection system of claim 19, wherein said change is or includes a step change.

21. The fault protection system of claim 19, wherein said change is or includes a ramp change, a sinusoidal change, and/or an exponential change.

22. The fault protection system of claim 18, wherein the processing circuitry is configured to detect the fault internal to the fault protection zone if a magnitude of the fault detection signal exceeds a detection threshold.

23. The fault protection system of claim 18, wherein the processing circuitry is configured to compare the fault detection signal with an expected fault detection signal that is expected upon occurrence of the fault internal to the fault protection zone and perform fault detection as a function of the comparison.

24. The fault protection system of claim 23, wherein the expected fault detection signal is or includes a triangular pulse.

25. The fault protection system of claim 18, wherein the differential measurement signal indicates, as the function of time, the difference between residual currents or residual voltages measured at the two or more terminals or boundaries of the fault protection zone.

26. The fault protection system of claim 25, wherein the processing circuitry is further configured to:

obtain, for each of multiple phases, a phase-specific differential measurement signal that indicates, as a function of time and for that phase, the difference between currents or voltages measured at the two or more terminals or boundaries of the fault protection zone; and generate, for each of the multiple phases, a phase-specific fault detection signal by cross-correlating the phase-specific differential measurement signal for that phase with the reference signal;

perform fault detection also as a function of the phase-specific fault detection signals.

27. The fault protection system of claim 26, wherein the processing circuitry is configured to detect the fault if the fault detection signal and at least one of the phase-specific fault detection signals each indicate occurrence of the fault internal to the fault protection zone at the same time.

28. The fault protection system of claim 18, wherein the differential measurement signal indicates, as the function of time, the difference between currents measured at the two or more terminals or boundaries of the fault protection zone.

29. The fault protection system of claim 18, wherein the processing circuitry is further configured to:

based on the fault detection performed, control a protection device that protects the electric power system from the fault; and/or based on the fault detection detecting occurrence of the fault internal to the fault protection zone, send a fault notification signal that indicates occurrence of the fault.

30. A method comprising:

obtaining a current or voltage measurement signal containing embedded evidence of a short-circuit fault in a fault protection zone of an electric power system;

generating a fault detection signal by cross-correlating the current or voltage measurement signal with a reference signal, wherein the reference signal is an expected current or voltage measurement signal that is expected upon occurrence of the short-circuit fault in the fault protection zone; and performing fault detection, for detecting a fault internal to the fault protection zone, as a function of the fault detection signal.

31. The method of claim 30, wherein performing fault detection comprises deciding whether or not the fault internal to the fault protection zone has occurred based respectively on whether or not a magnitude of the fault detection signal exceeds a detection threshold.

\* \* \* \* \*